US012198946B2

(12) United States Patent
Wu et al.

(10) Patent No.: US 12,198,946 B2
(45) Date of Patent: Jan. 14, 2025

(54) INTELLIGENT CUSTOMIZABLE WET PROCESSING SYSTEM

(71) Applicant: Yangtze Memory Technologies Co., Ltd., Hubei (CN)

(72) Inventors: Gonglian Wu, Hubei (CN); Yonggang Yang, Hubei (CN); Xianglin Lv, Hubei (CN); Rong Xu, Hubei (CN); Yuping Xia, Hubei (CN); Kaiyuan Liu, Hubei (CN); Jun Li, Hubei (CN); Zhenzhen Zhang, Hubei (CN); Jingyu Bai, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 433 days.

(21) Appl. No.: 17/647,754

(22) Filed: Jan. 12, 2022

(65) Prior Publication Data

US 2022/0139732 A1 May 5, 2022

Related U.S. Application Data

(60) Division of application No. 16/410,770, filed on May 13, 2019, now abandoned, which is a continuation of
(Continued)

(51) Int. Cl.
| | | |
|---|---|---|
| *H01L 21/67* | (2006.01) | |
| *H01L 21/02* | (2006.01) | |
| *H01L 21/677* | (2006.01) | |

(52) U.S. Cl.
CPC .. *H01L 21/67051* (2013.01); *H01L 21/02052* (2013.01); *H01L 21/6708* (2013.01); *H01L 21/67781* (2013.01); *H01L 21/6704* (2013.01)

(58) Field of Classification Search
CPC ......... H01L 21/67051; H01L 21/02052; H01L 21/6708; H01L 21/67781; H01L 21/6704
(Continued)

(56) References Cited

U.S. PATENT DOCUMENTS

| | | |
|---|---|---|
| 5,826,057 A | 10/1998 | Okamoto et al. |
| 6,260,562 B1 | 7/2001 | Morinishi et al. |

(Continued)

FOREIGN PATENT DOCUMENTS

| | | |
|---|---|---|
| CN | 103173766 A | 6/2013 |
| CN | 104040679 A | 9/2014 |

(Continued)

OTHER PUBLICATIONS

International Search Report and Written Opinion of the International Searching Authority directed to related International Patent Application No. PCT/CN2019/073713, mailed Oct. 29, 2019, 10 pages.

*Primary Examiner* — Tinsae B Ayalew
(74) *Attorney, Agent, or Firm* — Hanley, Flight & Zimmerman, LLC (57) ABSTRACT

Embodiments of wet processing systems and methods for uniform wet processing are disclosed. A method described in the present disclosure includes measuring one or more wafer characteristics of a wafer using a plurality of detectors and determining a wafer profile of the wafer based on the measured one or more wafer characteristics. The method also includes setting first and second sets of wet processing parameters of a wet processing system for respective first and second wafer regions based on the wafer profile, where a value of at least one wet processing parameter is different between the first and second sets of wet processing parameters. The method further includes performing wet processing on the wafer by dispensing one or more chemicals onto
(Continued)

the first and second wafer regions according to the respective first and second sets of wet processing parameters.

20 Claims, 4 Drawing Sheets

Related U.S. Application Data application No. PCT/CN2019/073713, filed on Jan. 29, 2019.

(58) Field of Classification Search
USPC ........................................................ 134/95.2
See application file for complete search history.

(56) References Cited

U.S. PATENT DOCUMENTS

| | | |
|---|---|---|
| 6,858,361 B2 | 2/2005 | Mui et al. |
| 8,501,499 B2 | 8/2013 | Sundararajan et al. |
| 2002/0063169 A1 | 5/2002 | Verhaverbeke et al. |
| 2003/0199168 A1 | 10/2003 | Yanagisawa et al. |
| 2004/0029388 A1 | 2/2004 | Verhaverbeke et al. |
| 2004/0050326 A1 | 3/2004 | Thilderkvist et al. |
| 2004/0092047 A1 | 5/2004 | Lymberopoulos et al. |
| 2008/0041430 A1 | 2/2008 | Cho et al. |
| 2008/0233269 A1 | 9/2008 | Carcasi et al. |
| 2013/0244442 A1 | 9/2013 | Ohmi et al. |
| 2014/0242731 A1 | 8/2014 | Mauer et al. |
| 2015/0190831 A1 | 7/2015 | Liu |
| 2015/0343495 A1 | 12/2015 | Kim et al. |
| 2017/0092550 A1 | 3/2017 | Rotondaro et al. |
| 2017/0352608 A1 | 12/2017 | Sueyoshi et al. |
| 2018/0301623 A1 | 10/2018 | Fujii et al. |
| 2020/0243352 A1 | 7/2020 | Wu et al. |

FOREIGN PATENT DOCUMENTS

| | | |
|---|---|---|
| CN | 107946191 A | 4/2018 |
| CN | 207637755 U | 7/2018 |
| CN | 108878319 A | 11/2018 |
| JP | 2005224681 A | 8/2005 |
| TW | 201721732 A | 6/2017 |

INTELLIGENT CUSTOMIZABLE WET PROCESSING SYSTEM

CROSS-REFERENCE TO RELATED APPLICATIONS

This application is a divisional application of U.S. patent application Ser. No. 16/410,770 titled "Intelligent Customizable Wet Processing System," and filed on May 13, 2019, which claims priority to PCT Patent Application No. PCT/CN2019/073713 filed on Jan. 29, 2019, both of which are incorporated herein by reference in their entireties.

TECHNICAL FIELD

The present disclosure generally relates to the field of semiconductor technology, and more particularly, to systems and methods for providing uniform processing of semiconductor wafers.

BACKGROUND

Semiconductor wafers undergo numerous processing operations during semiconductor wafer fabrication processing in an integrated circuit (IC) fabrication facility. Wet chemical processing chambers can be used to perform the processing operations, such as etching and cleaning of semiconductor wafers. The wet chemical processing chambers can include a nozzle positioned above the wafer and configured to dispense chemical solutions onto semiconductor wafers.

BRIEF SUMMARY

Embodiments of systems and methods for providing uniform processing in semiconductor wafers are described in the present disclosure.

In some embodiments, a method includes measuring one or more wafer characteristics of a wafer using a plurality of detectors and determining a wafer profile of the wafer based on the measured one or more wafer characteristics. The method also includes setting first and second sets of wet processing parameters of a wet processing system for respective first and second wafer regions based on the wafer profile, where a value of at least one wet processing parameter is different between the first and second sets of wet processing parameters. The method further includes performing wet processing on the wafer by dispensing one or more chemicals onto the first and second wafer regions according to the respective first and second sets of wet processing parameters.

In some embodiments, a method for processing a wafer in a wet processing system includes measuring one or more wafer characteristics of a wafer using a plurality of detectors and determining a wafer profile of the wafer based on the one or more wafer characteristics. The method also includes setting one or more parameters of the wet processing system based on the wafer profile and performing wet processing on the wafer by dispensing one or more chemicals into a processing chamber according to the one or more parameters. The method further includes determining whether wet processing results across the wafer are within a variation threshold value. In response to the determined wet processing results being within the variation threshold value, the method further includes maintaining the one or more parameters of the wet processing system. In response to the determined wet processing results being outside the variation threshold value, the method includes adjusting the one or more parameters of the wet processing system.

In some embodiments, a wet processing system includes a processing chamber and one or more detectors configured to determine one or more wafer characteristics of a wafer. The wet processing system also includes a spray nozzle positioned within the processing chamber. The wet processing system further includes a processing system configured to receive the one or more wafer characteristics; determine a wafer profile based on the one or more wafer characteristics; set one or more parameters of the wet processing system based on the wafer profile; and control the spray nozzle to dispense one or more chemicals into the processing chamber according to the one or more parameters.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more"

as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

Thin film deposition, photolithography, etching processes, and the like, are used to form various structures in semiconductor devices, such as disposing dielectric layers and forming interconnect structures. One such process is called wet chemical processing, which typically uses a chamber to perform wet chemical processing with various chemical solutions. Wet chemical processing chambers can be components of a variety of wet tools, which can handle either batches of wafers at a time (e.g., "multi-wafer" tools) or a single wafer at a time (e.g., "single-wafer" tools).

For example, in a single-wafer tool, a wafer enters a processing module and is positioned on a wafer stage. The wafer is then subjected to a wet chemical process where one or more nozzles positioned above the wafer's surface dispense chemicals (e.g., a chemical solution, deionized water, processing gas, etc.) onto the wafer's surface to react therewith. The chemical processes can be an etching process and/or a cleaning process that removes contamination from the wafer surface. While dispensing chemical solutions onto the wafer, nozzles can be located at a fixed position or can be moved around (typically) at a constant speed above the wafer. After the wafer fully reacts with the chemical solutions, the wafer can be rinsed with deionized water, dried off (e.g., via spinning), and removed from the wet chemical processing tool.

Both fixed-nozzle configuration or scanning nozzle configuration, which follows a constant scanning speed, may cause wafer processing non-uniformity due to different replenishing rates of the chemical solutions on different regions on the wafer. Different replenishing rates can also arise from wafer rotation during processing. Specifically, wafers are rotated around the center at a predetermined angular velocity during wet processing while chemical solution is dispense onto the wafer. The reacted chemical solution and byproducts are spun off while unreacted chemical solution continues to be dispensed onto the wafer by the nozzle. However, reacted chemical solution is spun off at a greater rate around the perimeter of the wafer and at a lower rate at the center of the wafer because tangential velocity at a point on the wafer is proportional to its distance from the rotational axis of the wafer (e.g., center of the wafer). Therefore, tangential velocity is lower towards the center of the wafer and higher towards the perimeter of the wafer, which results in reacted chemical solutions accumulating around the center region of the wafer. Reacted chemical solutions that is not removed but left to accumulate on the wafer can lead to reduced chemical reaction rate of the wafer material. For example, regions near the center of the wafer may have a lower etching rate compared to etching rates in regions near the perimeter of the wafer. In addition, structure variation across the wafer can cause processing non-uniformity during wet processing. For example, variations in thin film thickness, surface roughness, device density, and other factors can cause processing variations across the wafer and result in low device yield. Therefore, there is a need to improve wafer processing uniformity for wet processing during semiconductor fabrication.

To address the above shortcomings, embodiments described herein are directed to provide systems and methods for improving wafer processing uniformity in a wet processing system. More particularly, this disclosure is directed to a wafer processing system that is configured to determine wafer profiles prior to the wet processing process, such that each wet process is customized according to the wafer profile prior to and/or during wet processing. In addition, the wafer processing system is further configured to reduce wafer process non-uniformity by positioning the wafer nozzle at an angle that can be adjusted with respect to the wafer surface, as well as moving the nozzle at variable lateral scanning speeds based on the target portions of the wafer.

Various embodiments described in the present disclosure can provide benefits such as, among other things, improved wafer processing uniformity and reduced thickness variations in semiconductor devices such as, three-dimensional NAND memory devices. The improved wafer processing uniformity in turn ensures and improves the performance and yield of 3D NAND memory devices.

Figure 1:
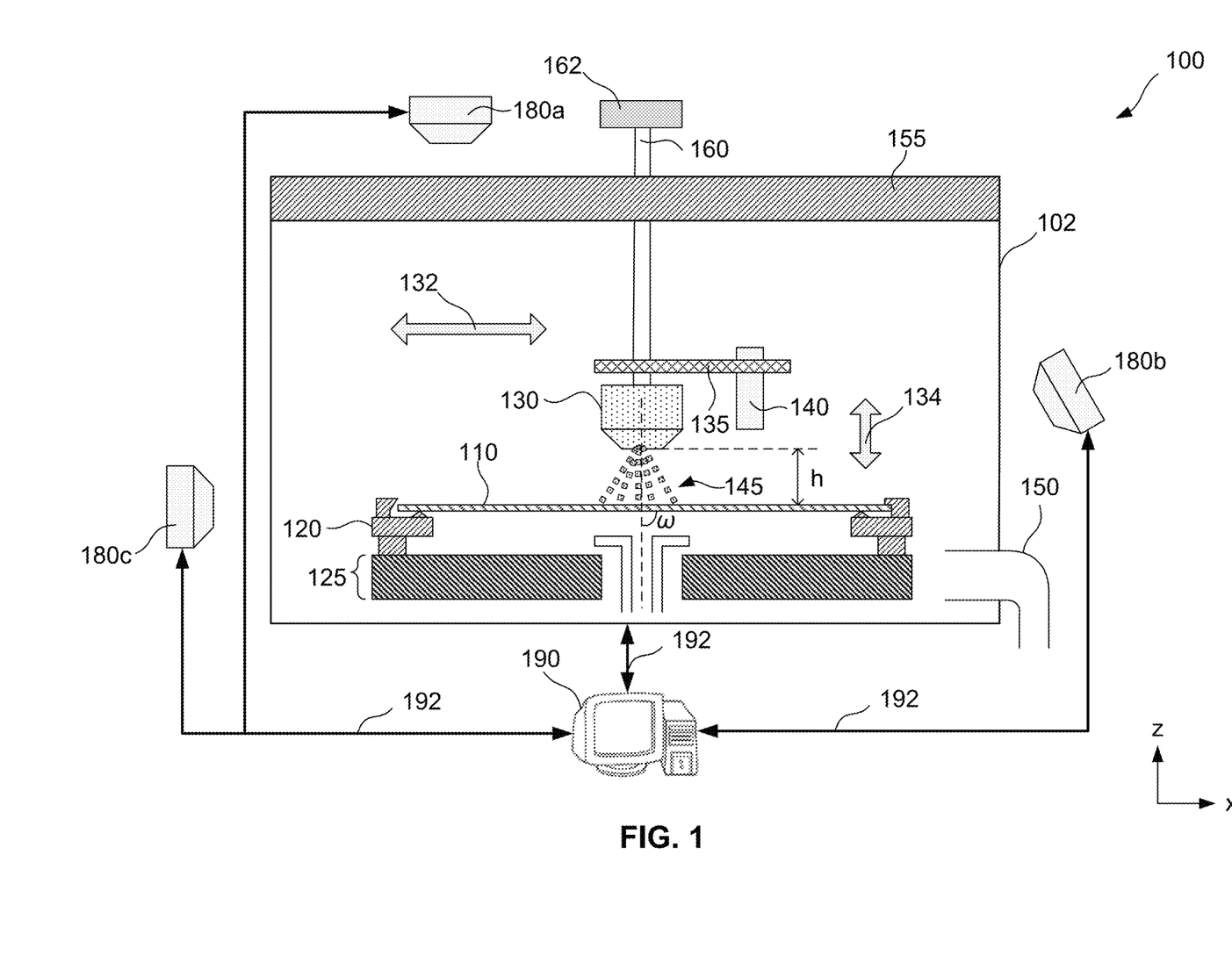
FIG. 1 illustrates a cross-sectional view of an exemplary single wafer processing station in a wet processing cluster tool, in accordance with some embodiments of the present disclosure.

FIG. 1 is a cross sectional view of an exemplary single-wafer wet chemical processing station 100. Processing station 100 can be a processing chamber of the wet chemical processing cluster tool (not shown in FIG. 1 for simplicity). The wet chemical processing cluster tool can include additional components, such as modules (e.g., transfer modules and wet chemical processing stations), robotic arms, pumps, exhaust lines, heating elements, gas and chemical delivery lines, controllers, valves, and external and internal electrical connections to other components of the cluster tool (e.g., computer units, chemical analyzers, mass flow controllers, pressure controllers, valves, and pumps). Such additional components, while not be depicted in FIG. 1, can be combined with those illustrated components without departing from the spirit and scope of this disclosure.

Processing station 100 can include processing chamber 102, wafer holder 120, spin base 125, spray nozzle 130, nozzle arm 135, motor 140, drain lines 150, fan filter unit (FFU) 155, distribution line 160, and chemical switch box 162. Processing station 100 can further include detectors 180a-180c positioned around processing chamber 102 to detect wafer characteristics. A processing system 190 can receive the detected wafer characteristics and generate wafer profiles to make adjustments during further processing.

In an embodiment, a wafer 110 is transferred into processing chamber 102 by a robotic arm and secured onto a wafer holder 120 using a clamp, a vacuum chuck, or the like. Wafer holder 120 is further attached to a spin base 125 of processing station 100. In some embodiments, wafer holder 120 can spin wafer 110 via spin base 125 during a wet chemical process or a drying process at different rotational speeds. In some embodiments, wafer 110 can be rotated at any suitable rotational speed during wet processing. For example, wafer 110 can be rotated at about 300 rpm, 500 rpm, 1000 rpm, 2000 rpm, or any suitable rotational speed.

Processing station 100 includes a spray nozzle 130 attached to a nozzle arm 135. Spray nozzle 130 can be moved laterally along the x-direction (e.g., along direction 132) by motor 140 through nozzle arm 135 such that spray nozzle 130 can be directly above any suitable region on wafer 110 such as, a center region or a peripheral region of wafer 110. Spray nozzle 130 can also be moved vertically in the y-direction (e.g., along direction 134) such that a height h between wafer 110 and spray nozzle 130 can be adjusted prior, during, or after the wet chemical processing. As illustrated in FIG. 1, height h is a distance between a tip of spray nozzle 130 and a top surface of wafer 110. In some embodiments, spray nozzle 130 can also rotate around motor 140 at various angular velocities. In some embodiments, spray nozzle 130 can be at a nominal angle ω with reference to the top surface of wafer 110. In some embodiments, angle ω can be between about 5° and about 90°. In some embodiments, other suitable parameters of spray nozzle 130 can be adjusted for the duration of the process based on the detected wafer profile and processing conditions. Such other adjustable parameters include, but are not limited to: the height h between spray nozzle 130 and wafer 110; the orientation of spray nozzle 130 with respect to a top surface of wafer 110; the lateral scanning speed of spray nozzle 130; the scanning areas of spray nozzle 130; and the flow rate of chemical solutions exiting spray nozzle 130. In some embodiments, processing station 100 can be equipped with multiple spray nozzles depending on the design of processing station 100. Spray nozzle 130 can dispense one or more chemicals in liquid, gas, or liquid/gas mixture forms onto the surface of wafer 110 such that the chemicals can react with the materials on wafer 110. By way of example and not limitation, spray nozzle 130 can be connected to one or more chemical switch boxes fluidly connected to external tanks filled with chemicals.

Chemical switch box 162 can be used to dispense suitable chemicals to processing station 100 through spray nozzle 130. Chemical switch box 162 can be a part of chemical distribution systems (not illustrated), where valves and chemical distribution lines are housed and chemical solutions are pre-mixed prior to delivery to spray nozzle 130 and other distribution nozzles. In some embodiments, chemical solutions can be pre-mixed and chemical switch boxes can be fluidly connected to spray nozzle 130. In some embodiments, distribution line 160 can be connected to processing chamber 102 to provide suitable chemicals into processing station 100. For example, suitable chemicals can be provided into processing station 100 through distribution line 160. In some embodiments, additional distribution lines can be installed at different enclosure surfaces of processing station 100, such as vertical walls and a bottom surface of the chamber enclosure, and are not illustrated for simplicity.

Chemical switch box 162 can further include switches that control the delivery of chemicals into processing station 100 based on a detected wafer profile. For example, distribution line 160 can be used to increase the flow rate of the chemicals provided to spray nozzle 130 when spray nozzle 130 is above a wafer region that is at an under-performed processing condition (e.g., under-etched). In some embodiments, distribution line 160 can be used to decrease the flow rate of the chemicals provided to spray nozzle 130 when spray nozzle 130 is above a wafer region that is at an over-performed processing condition (e.g., over-etched). In some embodiments, wafer 110 may or may not be rotated while a chemical solution 145 is dispensed on its surface.

Processing station 100 can also include a fan filter unit (FFU) providing filtered air for the interior of processing station 100. For example, an FFU 155 can be connected to a top surface of processing chamber 102 and can have more than one filter and more than one blower motor configured to provide a nominal air flow.

Drain lines 150 can be attached to processing chamber 102 to collect chemical solutions. According to some embodiments, the chemical solution can be collected through the one or more drain lines 150 to a collection tank after it has been disposed from the wafer's surface. In some embodiments, collection of the consumed chemical solution can be performed while wafer 110 spins during the wet chemical processing.

One or more detectors 180a-180c can be positioned around processing chamber 102. In some embodiments, detectors 180a-180c are positioned around sidewalls and top/bottom walls of processing chamber 102. For example, three detectors can be positioned around a rectangular-shaped processing chamber 102, with a detector facing a sidewall and a top wall of processing chamber 102. In some embodiments, viewports can be installed on sidewalls and the top wall of processing chamber 102 and aligned with respective detectors such that the interior of processing chamber 102 is visible to the respective detectors. In some embodiments, detectors 180a-180c can be within chamber 102. In some embodiments, detectors 180a-180c can be configured to detect wafer characteristics of wafer 110, such as, for example, layer composition and layer thickness of the thin films formed on wafer 110. In some embodiments, detectors 180a-180c can be installed in a detector chamber that is configured to detect wafer characteristics before wafer 110 is transported into processing chamber 102. In some embodiments, detectors 180a-180c can be a laser thickness sensor, optical profiler, multi-wavelength ellipsometer, ion beam analyzer, and/or any other suitable detectors or combinations thereof. In some embodiments, detectors 180a-180c can each be a charge-coupled device (CCD) camera that is a component of a CCD-based image detection system. In some embodiments, photocells, or other such automated detecting apparatus that detect an image of an area presented thereto can also be used. In some embodiments, detectors 180a-180c can include at least one CCD monochrome or color camera, depending on the process being inspected. Therefore, detectors 180a-180c can each be configured to produce one or more high resolution images of the wafer supply the high resolution images to a user or a processing system.

A processing system 190 can be electrically connected to detectors 180a-180c and processing chamber 102 through communication channels 192. Processing system 190 can include processing circuitry and software for analyzing signals produced by detectors 180a-180c and generate wafer profiles using the signals. Communication channels 192 can be any suitable wiring, fiber optics or wireless technology for transmitting signals. The generated wafer profiles can be suitable for viewing by a user. For example, the resulting wafer profiles can be displayed on processing system 190 or a viewing device such as a computer monitor located at, for example, an operator work station.

Based on the wafer profile, processing system 190 can determine a wet processing recipe or condition suitable for the wafer. For example, the wet processing condition can depend on whether or not the wafer has uniform characteristics (e.g., conformal thickness across the wafer). Specifically, processing system 190 can determine if a region on wafer 110 is under processed or over processed by comparing thin film thicknesses across wafer 110. Examples of an unacceptable, or non-conforming, wafer processing conditions is when a center region of wafer 110 is under-etched (e.g., greater remaining thin film thickness) or a peripheral is over-etched (e.g., less remaining thin film thickness). In some embodiments, processing system 190 can select a processing recipe or condition that can reduce the non-conforming characteristics of the wafer by under-process or over-process the corresponding regions. For example, the under-etched regions can be over-processed by having extensive chemical reaction time and the over-etched regions can be under-processed by having limited chemical reaction time. Processing system 190 can then determine if the processing results in uniform characteristics by comparing surface characteristics such as, for example, surface roughness, thin film composition, and/or any other suitable characteristics, or combinations thereof, across wafer 110. The detectors can be operated by processing system 190 to take a one-time measurement of wafer characteristics, or can be operated to continuously measure wafer characteristics at predetermined intervals during wafer processing. Therefore, the detectors can provide continuous monitoring of wafer processing and transmit the detected results to processing system 190 such that processing system 190 can adjust the processing recipe or conditions in real-time during the wet processing.

In some embodiments, the processing system 190 can be configured to receive extremely large data sets (e.g., big data) and computationally analyze them to reveal patterns, trends, and associations, relating to wafer processing conditions and the resulting processed wafer. Specifically, processing system 190 can receive from detectors collected data sets representing thickness, compositions, roughness, and any other suitable characteristics of the thin films, and analyze the data sets with reference to the wet processing parameters. The data sets can be used as a feedback for processing system 190 to fine tune the processing recipe in real-time or after processing such that the wet process can be continuously improved, which in turn results in improved wafer processing uniformity and device yield.

Processing system 190 can be configured to perform a variety of additional or alternative analytical tasks, such as analysis of any suitable signals, statistics processing, task scheduling, generation of alarm signals, generation of further control signals, and the like. For example, upon detection of processing non-uniformity, processing system 190 can be configured to generate alarm signals to alert a user and can be further configured to perform a series of scheduled tasks within the processing chamber in order to reduce the detected processing condition non-uniformity. In some embodiments, examples of non-uniformity in the wet processing results can include etching rate variations, thin film thickness variations, growth rate variations, and any other suitable variations across the wafer. In some embodiments, non-uniformity can be variations greater than 5%, 10%, 25% or any suitable variation thresholds across the wafer. In response to the wet processing result being outside the variation threshold, processing system 190 can adjust various processing parameters such as, for example, lateral nozzle scanning speed, position, and angle of spray nozzle 130, rotating speed of wafer 110, flow rate of chemical solution 145, combinations thereof, and any other suitable processing parameters. Processing system 190 can be placed adjacent processing chamber 102 so that, for example, an operator can easily access both processing system 190 and processing chamber 102 to determine the non-uniform processing condition and to attend to and to correct the cause of the condition. Alternatively, in some embodiments, processing system 190 can be placed at a remote location, such as a process command center where a variety of images from a variety of processing stations or wet benches can be monitored together.

Figure 2:
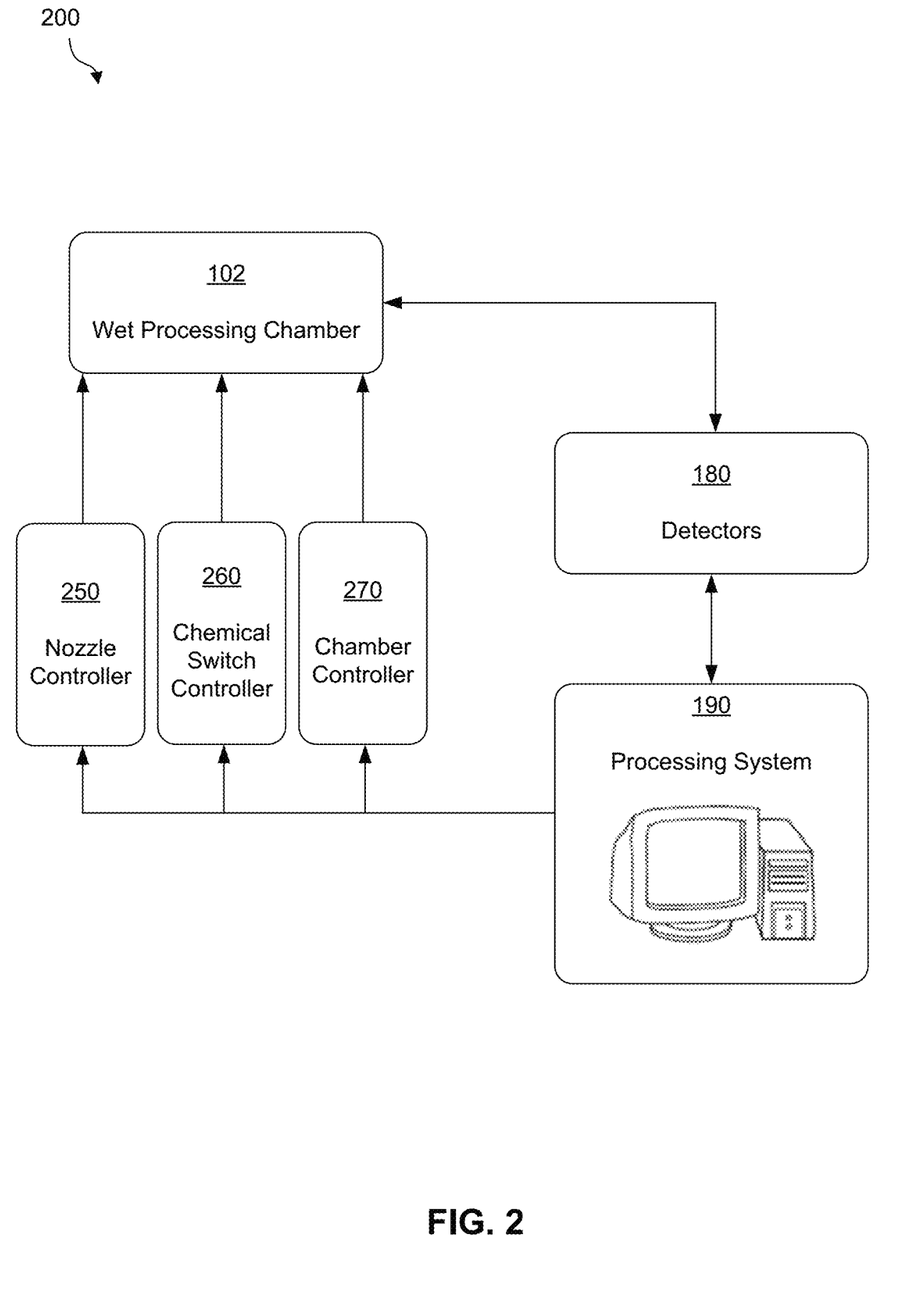
FIG. 2 an exemplary wet processing system, in accordance with some embodiments of the present disclosure.

FIG. 2 is an exemplary wet processing system, according to some embodiments. Exemplary wet processing system 200 illustrated in FIG. 2 can include wet processing chamber 102, detectors 180, processing system 190, nozzle controller 250, chemical switch controller 260, and chamber controller 270. Wet processing system 200 can further include other suitable components, such as additional detectors, sensors, pumps, valves, and are not illustrated in FIG. 2 for simplicity. In some embodiments, nozzle controller 250, chemical switch controller 260, and chamber controller 270 can include any suitable computer controlled modules such as valves, motors, or wafer stages. In some embodiments, the abovementioned controllers can control a variety of device parameters based on the generated wafer profile and monitoring of wafer processing uniformity. For example, with reference to FIGS. 1 and 2, nozzle controller 250 can control a height h between spray nozzle 130 and wafer 110, the orientation of spray nozzle 130 with respect to a top surface of wafer 110, the lateral scanning speed of spray nozzle 130, the scanning areas of spray nozzle 130, and other suitable parameters of spray nozzle 130. In some embodiments, spray nozzle 130 can be controlled by nozzle controller 250 to dispense one or more chemical solutions. In some embodiments, chemical switch controller 260 can be operated to open or close one or more chemical switches (e.g., chemical switch box 162) to start or stop chemical solution flow into processing chamber 102. In some embodiments, chemical switch controller 260 can also adjust the flow rate of chemicals. Chamber controller 270 can be operated to adjust any suitable parameters for wet processing, for example, chamber controller 270 can adjust fan speed of FFU 155, rotational speed of spin base 125, which in turn determines rotational speed of wafer 110, movement of wafer holder 120, and any other suitable parameters.

Detectors 180 and processing system 190 can determine a wafer profile for wafers transported into wet processing chamber 102 for wet processing. Detectors 180 can measure various characteristics of the wafer. For example, detectors 180 can determine the composition of the wafer, structures formed on the wafer, thicknesses and thickness variations of thin films formed on the wafer, Detectors 180 can be laser thickness sensors, optical profilers, multi-wavelength ellipsometer, ion beam analyzers, CCD cameras, and/or any other suitable detectors. In some embodiments, detectors 180 can be similar to detectors 180a-180c described above in FIG. 1. Processing system 190 receives the measured characteristics of the wafer and determine a wafer profile that can be used to adjust wafer processing conditions accordingly. Specifically, processing system 190 can adjust parameters of wet processing in wet processing chamber 102 based on the wafer profile. In some embodiments, detectors 180 can measure thin film thicknesses across the wafer and processing system 190 can generate a wafer profile regarding thin film thickness. The wafer profile can include information such as thin film thicknesses and their correlations with regions of the wafer. For example, in a wet etching process to remove portions of the thin film, processing system 190 can receive the measured thin film thicknesses from detectors 180 and may determine that thin film thickness is greater at the center region of the wafer and lower near the perimeter of the wafer. As a result, processing system 190 can control spray nozzle 130 through nozzle controller 250 such that when spray nozzle 130 is above the wafer center region, it can increase the chemical reactions by (i) scanning (e.g., moving) at a slower speed, and/or (ii) using an increased chemical flow rate, and/or (iii) reducing nozzle angle with reference to wafer top surface such that the chemical reactions can be continuously performed.

Figure 3:
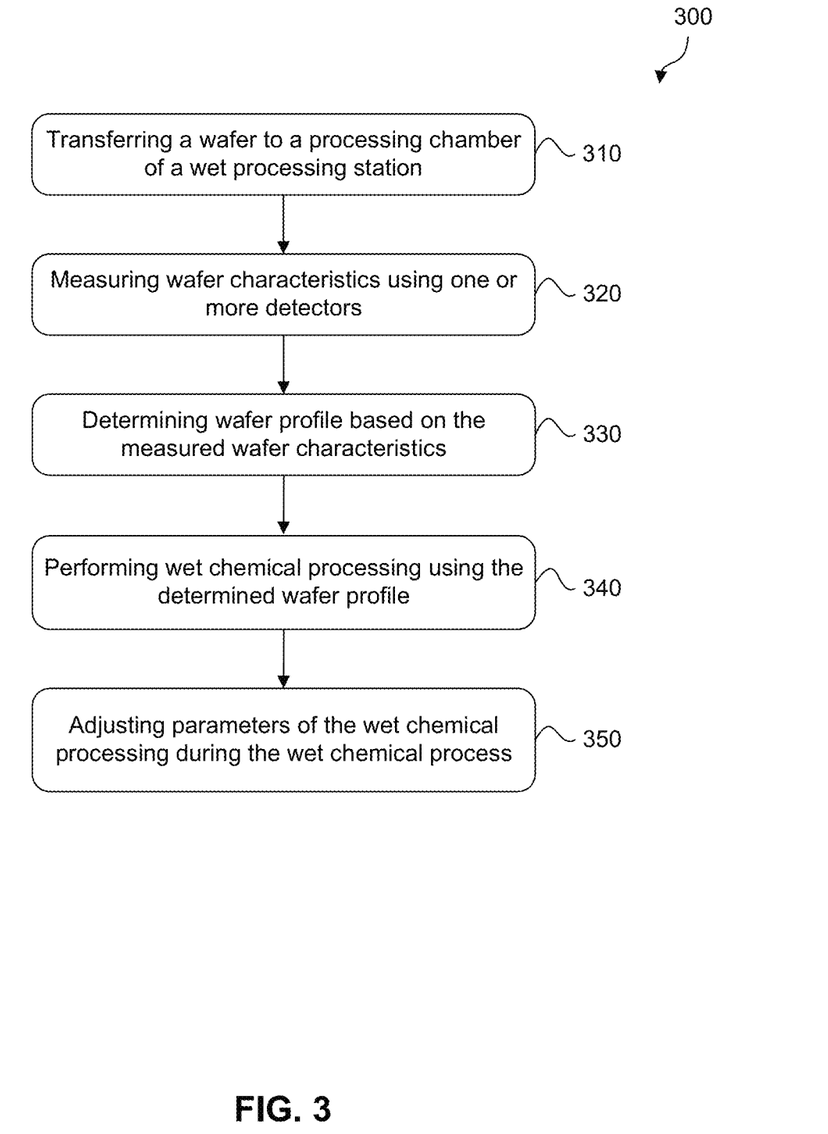
FIG. 3 is a flow diagram of performing an exemplary wet process for a wafer processing station, in accordance with some embodiments of the present disclosure.

FIG. 3 is a flow chart of method 300, which describes an exemplary uniform wafer processing for a wet chemical processing station, according to some embodiments. By way of example and not limitation, the wet chemical processing of method 300 can be performed in processing station 100 and wet processing system 200 shown in FIGS. 1 and 2 respectively. This disclosure is not limited to this operational description. Rather, other operations are within the spirit and scope of the present disclosure. It is to be appreciated that additional operations may be performed. Moreover, not all operations may be needed to perform the disclosure provided herein. Further, some of the operations may be performed simultaneously, or in a different order than shown in FIG. 3. In some implementations, one or more other operations may be performed in addition to or in place of the presently described operations. For illustrative purposes, method 300 is described with reference to the embodiments of FIGS. 1, 2, 4A-4B, and 5. However, method 300 is not limited to these embodiments.

For example purposes, method 300 will be described for a single-wafer wet chemical processing station. Based on the disclosure herein, method 300 can be equally applied to batch wet chemical processing stations that can process multiple wafers at a time. Both wet chemical processing station configurations (single-wafer and batch) are within the spirit and scope of this disclosure.

Method 300 begins with operation 310, where a wafer is transferred to a processing chamber of a wet processing station, according to some embodiments. For example, wafer 110 can be transferred to wet chemical processing chamber 102 via a transfer module with a robotic arm (not shown). As discussed above, wet chemical processing chamber 102 can be a module in a wet processing cluster tool (e.g., wet chemical processing station 100), which can further include additional wet chemical processing stations, modules, and equipment appropriate for its operation.

In operation 320 of method 300, one or more detectors are configured to detect any suitable wafer characteristics, according to some embodiments. The one or more detectors can be configured to detect compositions and thicknesses of the thin films formed on the wafer. For example, the one or more detectors can determine that alternating layers of silicon oxide and silicon nitride are formed on the wafer. In some embodiments, the one or more detectors can measure thicknesses and thickness variations across the wafer of the thin film layers. In some embodiments, the one or more detectors can be configured to measure thin film thicknesses at a selected region of the wafer and also configured to record the position information of the region. For example, the one or more detectors can detect that a silicon oxide film disposed around the center region of the wafer (e.g., within 15% of the wafer radius from the wafer center) has a thickness that is about 100 nm, and the thickness of the silicon oxide film in other regions of the wafer (e.g., between 15% and 100% of the wafer radius from the wafer center) has a thickness that is about 120 nm. In some embodiments, the one or more detectors can be installed in a load lock chamber that is configured to transport the wafer into the processing chamber. In some embodiments, the one or more detectors can be installed in the processing chamber. In some embodiments, the one or more detectors can be laser thickness sensors, optical profiler, multi-wavelength ellipsometer, ion beam analyzer, and/or any other suitable detectors. In some embodiments, the one or more detectors can be detectors 180a-180c and 180 described above in FIGS. 1 and 2, respectively.

In operation 330 of method 300, wafer profile is determined by a processing system, such as the processing system 190, based on the detected wafer characteristics, according to some embodiments. The processing system can include suitable processing circuitry and software for generating wafer profiles by analyzing wafer characteristics received from the detectors. The generated wafer profiles can be suitable for viewing by a user. The processing system can generate a wafer profile based on the received wafer characteristics. In some embodiments, the processing system can determine composition, thickness, roughness, and any other suitable characteristics of the thin films formed on the wafer based on the wafer characteristics measured by the detectors. In some embodiments, the processing system can also measure dimensions and densities of semiconductor structures formed on the wafer.

Additionally, the processing system can determine pre-existing (e.g., before wet processing) non-uniformity of the wafer based on measured wafer characteristics. For example, detectors can measure dimensions and density of the structures on the wafer and the processing system can determine if the structures dimension and density are uniform (e.g., conformal) across the wafer. In some embodiments, the processing system can determine if a region on the wafer is under processed or over processed by comparing thin film thicknesses across the wafer. An example of an unacceptable, or non-conforming, wafer characteristic is that a center region of the wafer is under-etched (e.g., greater remaining thin film thickness) and a peripheral is over etched (e.g., less remaining thin film thickness). In some embodiments, the user or the processing system can determine if the wafer characteristics are uniform by comparing surface characteristics such as, for example, surface roughness, thin film composition, and/or any other suitable characteristics across the wafer. In some embodiments, the detectors can be operated by the processing system to take a one-time measurement of wafer characteristics.

Based on the determined wafer profile that can also include any pre-existing non-uniformity, the processing system can generate suitable wet processing recipes or nominal processing conditions for the wafer. Alternatively, the processing system can retrieve a suitable processing recipe from a storage medium within the processing system or a remote server. In some embodiments, the generated wafer profiles can be stored in the storage medium. Examples for the processing system and the wafer can be processing system 190 and wafer 110 described above, respectively.

In operation 340 of method 300, the wafer is exposed to a wet chemical process based on the determined wafer profile, according to some embodiments. In some embodiments, the wafer profile can be determined by the processing system prior to wet processing, and the processing system is configured to generate or load a wet processing recipe that is suitable for the wafer profile such that the wafer processing can be uniform. For example, the processing system can adjust wet processing parameters such as nozzle angle, scanning speed, chemical flow rate, wafer rotating speed, and any other suitable parameters. In some embodiments, the wafer profile can be a dynamic wafer profile where the detectors are operated to continuously measure wafer characteristics at predetermined intervals during wafer processing and periodically update the wafer profile. Therefore, the detectors can provide continuous monitoring of wafer processing and transmit the detected processing results to the processing system such that the processing system can adjust processing recipe or chamber conditions in real-time during the wet processing. In some embodiments, the amount of data representing measured wafer characteristics can be relatively large and is considered as big data. The processing system can be configured to receive the big data and computationally analyze them to reveal patterns, trends, and associations, relating to wafer processing conditions and the resulting processed wafer. Receiving and processing big data can be a feedback mechanism for the processing system to fine tune the processing recipe in real-time or after processing such that the wet process can be continuously improved, which in turn results in improved wafer processing uniformity and device yield.

Figure 4A:
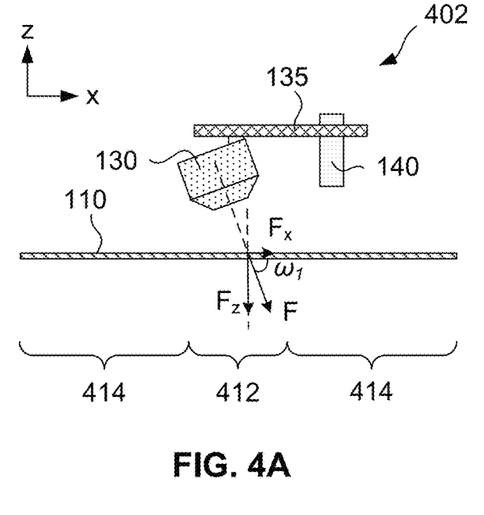
FIGS. 4A-4B are exemplary configurations of spray nozzle in a wafer processing station, in accordance with some embodiments of the present disclosure.
Figure 4B:
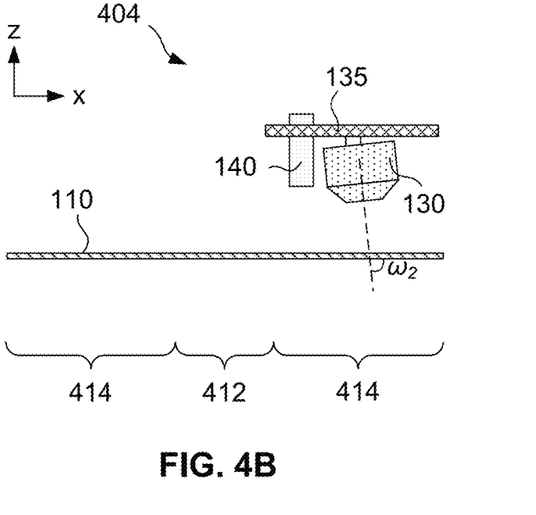
Figure 5:
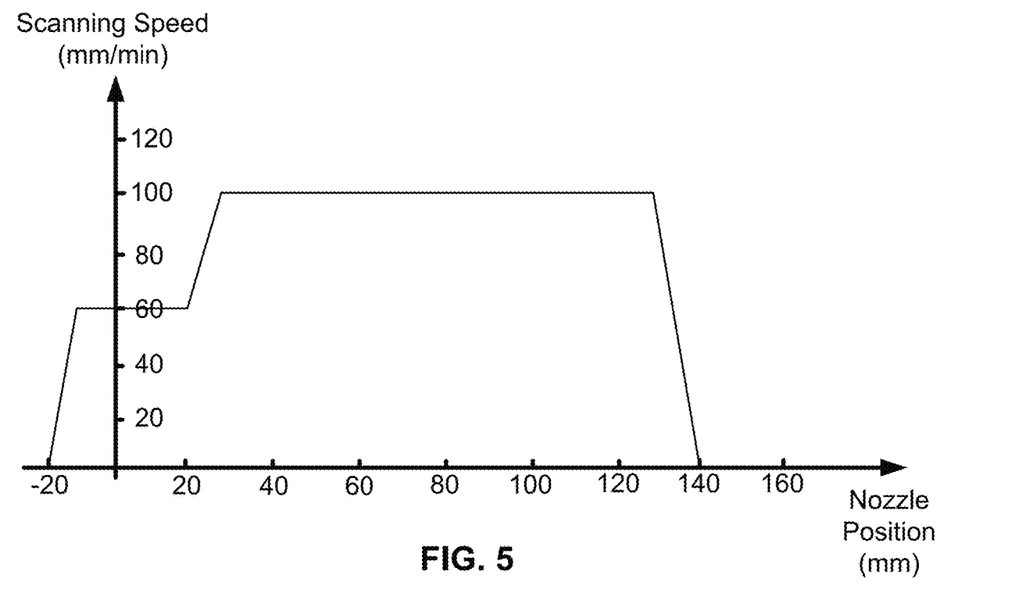
FIG. 5 is a diagram illustrating exemplary scanning speeds of a spray nozzle in a wafer processing station, in accordance with some embodiments of the present disclosure.

The processing system can also adjust wet processing parameters to improve processing rate uniformity across the wafer. For example, the processing system can increase etching rate in regions near the center of the wafer that that it is substantially similar compared to etching rates in regions near the perimeter of the wafer. Specifically, the processing system can adjust nozzle angle and/or scanning speed of the nozzle to increase etching rate in regions near the center of the wafer. FIGS. 4A-4B illustrate exemplary nozzle angles configured in various regions of the wafer for reducing processing non-uniformity. FIG. 5 illustrates an exemplary lateral nozzle scanning speed configuration for reducing processing non-uniformity, where the scanning speed of spray nozzle is plotted against various nozzle positions along the radius of the wafer. Structures illustrated in FIGS. 4A-4B that are similar to those illustrated in FIGS. 1-2 may use the same numerals for ease of explanation; however, this repetition does not in itself dictate a relationship between the various embodiments and/or configurations discussed.

FIGS. 4A-4B illustrate spray nozzle 130 positioned over wafer 110. Merely for the ease of description, wafer 110 can be divided into center region 412 and peripheral region 414. Center region 412 can be a region that is within about 15% of the wafer radius from the wafer center, and peripheral region 414 covers the rest of the wafer other than the center region. In some embodiments, center region 412 and peripheral region 414 can be any suitable regions on wafer 110, for example, center region 412 can have a radius of about 2%, 5%, 10%, 20% or any suitable ratio of the wafer radius, depending on the thin film compositions, structures formed on the wafer, and wafer radius. As an example, wafer 110 can be a twelve-inch (e.g., 300 mm) wafer having a radius of 150 mm. In some embodiments, the radius of center region 412 can be about 20 mm. As areas within center region 412 have a lower tangential velocity compared to areas on peripheral region 414, reacted chemicals tend to accumulate within center region 412 and reduce processing rate within center region 412.

The processing system can be configured to remove the reacted chemicals and replenish with un-reacted chemicals by adjusting spray nozzle angle $\omega$ to an acute angle (e.g., less than 90°) with reference to top surface of wafer 110. As shown in configuration 402 where spray nozzle 130 is above center region 412, spray nozzle 130 can be at a first acute angle $\omega_1$ with reference to wafer 110. A force F is exerted onto wafer 110 due to momentum change of unreacted chemicals when dispensed onto wafer 110 by spray nozzle 130. For simplicity, force F is also applied at the first acute angle $\omega_1$ onto wafer 110. Force F can be resolved into components along the horizontal x-axis and the vertical z-axis, respectively represented by $F_x$ and $F_z$. It can be determined that $F_x = F \cos \omega_1$ and $F_z = F \sin \omega_1$. Horizontal force component $F_x$ can laterally push accumulated reacted chemicals away from center region 412 and towards the perimeter of the wafer. Simultaneously, unreacted chemicals dispensed by spray nozzle 130 replaces the removed reacted chemicals and react with the thin films or structures on wafer 110. Because horizontal force component $F_x$ increases as first acute angle $\omega_1$ decreases, the processing system can set first acute angle $\omega_1$ based on how fast the accumulated reacted chemicals needed to be moved away towards the perimeter of the wafer. In some embodiments, first acute angle $\omega_1$ can be between about 30° and about 75°. For example, first acute angle $\omega_1$ can be between about 30° and about 45°. In some embodiments, first acute angle $\omega_1$ can be between about 45° and about 75°. In some embodiments, the lateral scanning speed of spray nozzle 130 within center region 412 can be between about 40 mm/min and about 80 mm/min.

In some embodiments, the processing system can control chemical switches such that chemicals can be dispensed at a greater flow rate from spray nozzle 130, which in turn increases the removal rate of reacted chemicals from center region 412. In some embodiments, the processing system can also adjust positions and corresponding scanning speeds of spray nozzle 130. As illustrated in FIG. 5, spray nozzle 130 moves through center region 412 by starting from a boundary of center region 412 (e.g., —20 mm away from wafer center), moving through center of wafer (e.g., origin), and arriving at opposite boundary of center region 412 (e.g., 20 mm away from wafer center). The processing system can configure the spray nozzle 130 to be moving at a relatively low scanning speed for the duration of the above scanning motion. For example, the spray nozzle can be moving at a lateral scanning speed of about 60 mm/min. In some embodiments, any suitable lateral scanning speeds can be used.

As the processing system moves spray nozzle 130 from center region 412 into peripheral region 414, the processing system can adjust spray nozzle angles as well as lateral scanning speeds. For example, the processing system can increase the acute angle between spray nozzle 130 and top surface of wafer 110 to a second acute angle $\omega_2$ and increase the lateral scanning speed of spray nozzle 130 to about 100 mm/min. In some embodiments, second acute angle $\omega_2$ can be greater than first acute angle $\omega_1$ because areas in peripheral region 414 can have greater tangential velocity compared to areas in center region 412 and reacted chemicals can be removed more easily through rotations of the wafer. In some embodiments, second acute angle $\omega_2$ can be greater than about 75° and less than about 90°. The processing system can configure the spray nozzle 130 to be moving at a relatively high scanning speed for the duration of the above scanning motion. In some embodiments, the lateral scanning speed of spray nozzle 130 within peripheral region 414 can be between about 80 mm/min and about 120 mm/min.

In operation 350 of method 300, the parameters of the wet chemical process can be adjusted during the wet chemical process, according to some embodiments. In some embodiments, the parameters of the wet chemical process can be adjusted depending on real-time processing conditions and processing results detected by the detectors and analyzed by the processing system. In response to the processing results are within a predetermined variation threshold, the processing system can maintain the current set values of one or more parameters of the wet processing. On the other hand, in response to processing results detected by the detectors being outside the predetermined threshold, the processing system can be configured to adjust one or more parameters of the wet processing such that the wet processing is uniform across the wafer.

In some embodiments, examples of processing non-uniformity can include etching rate variations, thin film thickness variations, growth rate variations, and any other suitable variations across the wafer. In some embodiments, non-uniformity threshold can be variations greater than 5%, 10%, 25% or any suitable variation thresholds across the wafer. The one or more parameters for wet processing can be lateral nozzle scanning speed, position, and angle of spray nozzle 130, rotating speed of wafer 110, flow rate of chemical solution 145, combinations thereof, and any other suitable processing parameters. For example, the processing system can adjust the processing parameters in real-time depending on the processing rates of thin film in various regions of the wafer. Specifically, in response to a region of the wafer being over etched during a wet etching process, the processing system can set a greater lateral scanning speed to reduce the amount of chemicals dispensed on the region. For example, during an etching process designed to reduce thin film thickness by 50 nm, the detectors may detect during processing that thin film thickness in a center region of the wafer has been reduced by 20 nm while thin film thickness in a peripheral of the wafer has been reduced by 40 nm.

The processing system can be configured to adjust processing parameters based on the detected thickness differences and increase the etching rate in the center region of the wafer such that the removed thin film thickness can be uniform across the center and peripherals. As an example, the processing system can decrease the lateral scanning speed of the spray nozzle while it is above the center region and/or increase the lateral scanning speed when the spray nozzle is above the peripherals. The scanning speed differences can increase the relative etching rate in the center region. Additionally, the processing system can also adjust the spray nozzle angle in real-time based on the processing condition. For example, the spray nozzle angle can be adjusted by the processing system to a smaller value in response to a detected lower processing rate in a region of the wafer, such that reacted chemicals can be removed at a greater rate. In some embodiments, the processing system can increase or decrease chemical flow rate in suitable regions of the wafer to adjust processing rates and conditions such that processing across wafer is uniform.

Various embodiments described in the present disclosure are directed to systems and methods for improving wafer processing uniformity in a wet processing system. More particularly, this disclosure is directed to a wafer processing system that is configured to detect and determine wafer profiles prior to the wet processing process, such that each wet process is customized according to the wafer profile. In addition, the wafer processing system is further configured to reduce wafer process non-uniformity by positioning the wafer nozzle at an adjustable angle with reference to the wafer surface and moving the nozzle at adjustable scanning speeds based on the target portions of the wafer. In addition, the embodiments described in the present disclosure can provide benefits such as, among other things, improved wafer processing uniformity and reduced thickness variations in semiconductor devices such as, three-dimensional NAND memory devices. The improved wafer processing uniformity in turn ensures and improves the performance and yield of 3D NAND memory devices.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A wet chemical processing system, comprising:
one or more detectors configured to determine one or more wafer characteristics of a wafer;
a spray nozzle;
a wafer holder configured to receive a wafer; and
a processing system configured to:
receive the one or more wafer characteristics;
determine a wafer profile based on the one or more wafer characteristics;
set a first set of wet processing parameters of a wet processing system for a center region based on the wafer profile, wherein the first set of wet processing parameters includes a first angle of the spray nozzle, and wherein the first angle is set between a first direction of the spray nozzle and a top surface of the wafer;
perform wet processing on the wafer by dispensing one or more chemicals onto the center region according to the first set of wet processing parameters;
set a second set of wet processing parameters of the wet processing system for a peripheral region based on the wafer profile, wherein the second set of processing parameters includes a second angle of the spray nozzle set between a second direction of the spray nozzle and the top surface of the wafer, and the first angle is less than the second angle;
change an angle of the spray nozzle from the first angle to the second angle as the spray nozzle is moving from above the center region to above the peripheral region; and
perform wet processing on the wafer by dispensing the one or more chemicals onto the peripheral region according to the second set of wet processing parameters.

2. The wet chemical processing system of claim 1, wherein the first or second set of wet processing parameters further includes a height of the spray nozzle.

3. The wet chemical processing system of claim 1, wherein the one or more wafer characteristics include thin film thicknesses and thin film compositions.

4. The wet chemical processing system of claim 1, wherein the first and second angles are acute angles.

5. The wet chemical processing system of claim 1, further including a processing chamber, wherein the spray nozzle and the wafer holder are positioned within the processing chamber.

6. The wet chemical processing system of claim 1, wherein the first and second sets of wet processing parameters further include first and second lateral scanning speeds of the spray nozzle, and wherein the first lateral scanning speed is less than the second lateral scanning speed.

7. The wet chemical processing system of claim 1, wherein the processing system is further configured to position the spray nozzle above the center region of the wafer, and wherein the center region of the wafer includes wafer surface areas that are within 15% of a wafer radius from a wafer center.

8. The wet chemical processing system of claim 1, wherein the first angle is between about 30° and about 75°.

9. The wet chemical processing system of claim 1, wherein the second angle is between about 75° and about 90°.

10. The wet chemical processing system of claim 1, wherein the processing system is further configured to:
move the spray nozzle over the center region at a first lateral scanning speed;
move the spray nozzle over the peripheral region at a second lateral scanning speed different from the first lateral scanning speed; and
change from the first lateral scanning speed to the second lateral scanning speed concurrently with the change of the angle of the spray nozzle.

11. A wet chemical processing system, comprising:
a spray nozzle;
a wafer holder configured to receive a wafer; and
a nozzle controller configured to:
set a first direction of the spray nozzle when the spray nozzle is above a center region of the wafer, wherein a first angle of the spray nozzle is set between the first direction of the spray nozzle and a top surface of the wafer;
perform wet processing on the center region by dispensing, through the spray nozzle set at the first direction, one or more chemicals onto the center region;
change an angle of the spray nozzle from the first angle to a second angle as the spray nozzle is moving from above the center region to above a peripheral region of the wafer, wherein the second angle of the spray nozzle is set between a second direction of the spray nozzle and a top surface of the wafer, and wherein the first angle is less than the second angle;
set the spray nozzle to the second direction when the spray nozzle is above the peripheral region; and
perform wet processing on the peripheral region by dispensing, through the spray nozzle set at the second direction, the one or more chemicals onto the peripheral region.

12. The wet chemical processing system of claim 11, wherein the nozzle controller is further configured to adjust a height of the spray nozzle.

13. The wet chemical processing system of claim 11, wherein the nozzle controller is further configured to adjust a flow rate of the spray nozzle.

14. The wet chemical processing system of claim 11, wherein the first and second angles are acute angles.

15. The wet chemical processing system of claim 11, further including a processing chamber, wherein the spray nozzle and the wafer holder are positioned within the processing chamber.

16. The wet chemical processing system of claim 11, wherein the nozzle controller is further configured to move the spray nozzle at first and second lateral scanning speeds in the center region and the peripheral region, respectively, and wherein the first lateral scanning speed is less than the second lateral scanning speed.

17. The wet chemical processing system of claim 11, wherein the nozzle controller is further configured to position the spray nozzle above the center region, and wherein the center region includes wafer surface areas that are within 15% of a wafer radius from a wafer center.

18. The wet chemical processing system of claim 11, wherein the first angle is between about 30° and about 75°.

19. The wet chemical processing system of claim 11, wherein the second angle is between about 75° and about 90°.

20. The wet chemical processing system of claim 11, wherein the nozzle controller is further configured to:
   move the spray nozzle over the center region at a first lateral scanning speed;
   move the spray nozzle over the peripheral region at a second lateral scanning speed different from the first lateral scanning speed; and
   change from the first lateral scanning speed to the second lateral scanning speed concurrently with the change of the angle of the spray nozzle.

\* \* \* \* \*